United States Patent [19]

Cardinali et al.

[11] Patent Number: 5,449,405
[45] Date of Patent: Sep. 12, 1995

[54] MATERIAL-SAVING RESIST SPINNER AND PROCESS

[75] Inventors: Thomas J. Cardinali, Burlington, Vt.; Burn J. Lin, Scarsdale, N.Y.

[73] Assignee: International Business Machines Corporation, Armonk, N.Y.

[21] Appl. No.: 34,974

[22] Filed: Mar. 22, 1993

Related U.S. Application Data

[63] Continuation of Ser. No. 784,290, Oct. 29, 1991, abandoned.

[51] Int. Cl.$^6$ .................. C23C 14/00; B08B 3/00; B65C 13/00
[52] U.S. Cl. ............................. 118/50; 118/52; 118/61; 118/64; 118/313; 118/315; 118/320; 134/105; 134/902
[58] Field of Search .......... 118/52, 50, 61, 64, 118/313, 315, 320; 134/902, 105

[56] References Cited

U.S. PATENT DOCUMENTS

| | | | |
|---|---|---|---|
| 4,290,384 | 9/1981 | Ausschnitt et al. | 118/722 |
| 4,347,302 | 8/1982 | Gotman | 430/270 |
| 4,416,213 | 11/1983 | Sakiya | 118/52 |
| 4,510,176 | 4/1985 | Cuthbert et al. | 427/82 |
| 4,732,785 | 3/1988 | Brewer | 427/240 |
| 4,790,262 | 12/1988 | Nakayama et al. | 118/52 |
| 4,794,021 | 12/1988 | Potter | 427/240 |
| 4,800,836 | 1/1989 | Yamamoto et al. | 118/52 |
| 5,002,008 | 3/1991 | Ushijima et al. | 118/313 |
| 5,095,848 | 3/1992 | Ikeno | 118/52 |
| 5,234,499 | 8/1993 | Sasaki et al. | 118/52 |

FOREIGN PATENT DOCUMENTS

| | | |
|---|---|---|
| 0026081 | 4/1981 | European Pat. Off. . |
| 0363235 | 4/1990 | European Pat. Off. . |
| 2743011 | 3/1979 | Germany . |
| 54-131488 | 10/1979 | Japan . |
| 56-54435 | 5/1981 | Japan . |
| 57-130432 | 8/1982 | Japan . |
| 61-029125 | 2/1986 | Japan . |
| 61-95523 | 5/1986 | Japan . |
| 61-235833 | 10/1986 | Japan . |
| 63-185028 | 7/1988 | Japan . |
| 64-48417 | 2/1989 | Japan . |
| 1064217 | 3/1989 | Japan . |
| 226668 | 1/1990 | Japan . |
| 2098126 | 4/1990 | Japan . |
| 2134813 | 5/1990 | Japan . |
| 2192717 | 7/1990 | Japan . |

OTHER PUBLICATIONS

K. Skidmore, "To Obtain Photoresist Films with the Characteristics Necessary for Fabricating VLSI/ULSI ICs, An Understanding and Control of Many Parameters is Required" Semiconductor International, pp. 57–62 (Feb. 1988).

*Primary Examiner*—Janyce Bell
*Attorney, Agent, or Firm*—Graham S. Jones, II; Charles W. Peterson, Jr.

[57] ABSTRACT

Spin coating of resist on a semiconductor wafer is done in a controlled chamber, starting with introducing a resist solvent vapor into the chamber from a nozzle or an adjacent chamber, applying the resist by spraying a very thin layer of the resist material and then removing solvent from the chamber. The result is a saving in resist material and enhanced coating uniformity.

14 Claims, 3 Drawing Sheets

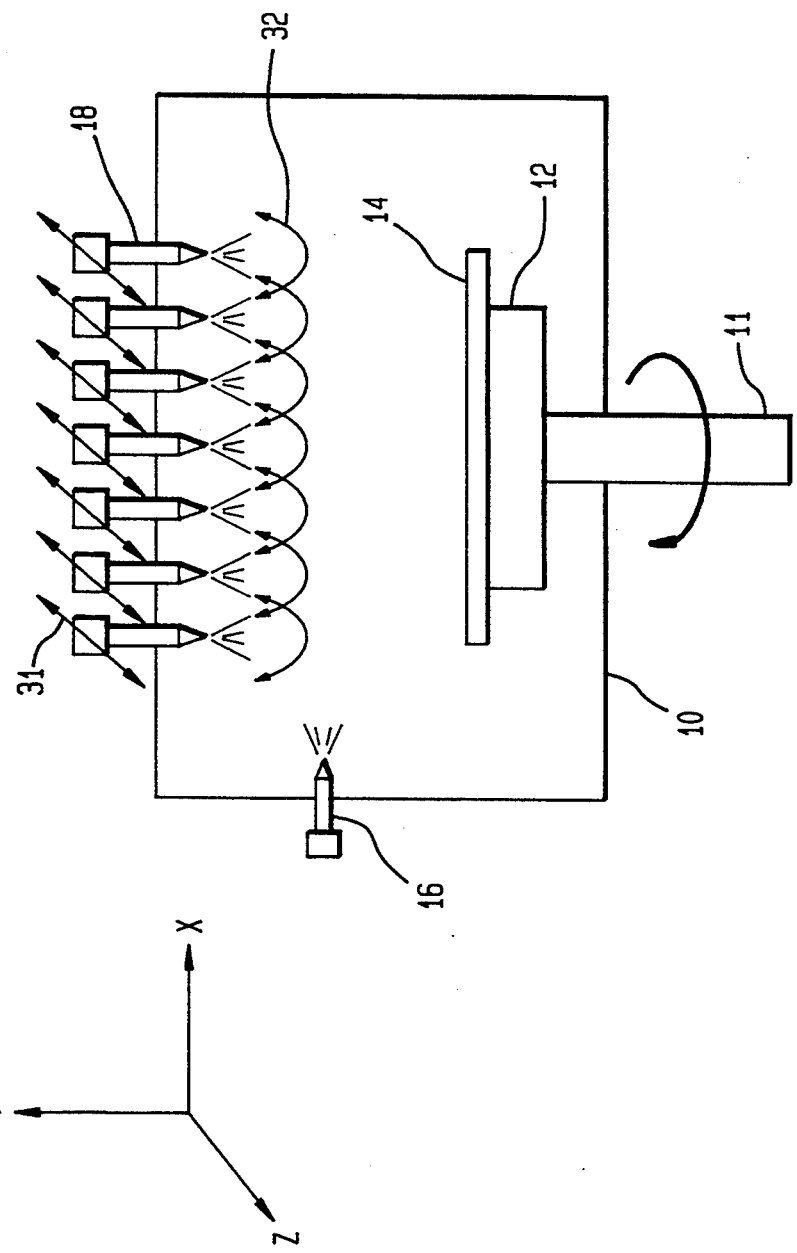

MATERIAL-SAVING RESIST SPINNER AND PROCESS

This application is a continuation of prior application Ser. No. 07/784,290 filed on Oct. 9, 1991, now abandoned.

BACKGROUND OF THE INVENTION

1. FIELD OF THE INVENTION

This invention relates to apparatus for spinning of photoresist upon a work piece, and more particularly to optimizing the quantity of photoresist used.

2. DESCRIPTION OF RELATED ART

In photolithography, photoresist (also usually referred to in the art as resist and referred to both ways herein interchangeably) is deposited upon a work piece to be patterned by the photolithography process. The expense of the quantity of photoresist used is the most or nearly the most expensive part of the cost of the process currently, depending upon prices of the materials used. Unfortunately, conventional resist spinners waste expensive resist material. In an application to manufacturing of semiconductor wafers, for example, a thick film of photoresist in the form of a puddle millimeters in height is delivered to cover most of a semiconductor wafer. Then the surplus photoresist material is spun off the semiconductor wafer surface, leaving an ultimate thickness of photoresist which is only on the order of several micrometers on the surface of the wafer. A very economical process currently requires 5 ml of photoresist material for each six inch diameter wafer.

U.S. Pat. No. 4,800,836 of Yamamoto et al for "Resist Coating Apparatus" neither introduces nor removes vapor from the chamber in which the resist is dumped on the substrate. No spraying is employed and there is no delay after application.

U.S. Pat. No. 4,416,213 of Sakiya for "Rotary Coating Apparatus" does not control the environment of the deposited resist.

U.S. Pat. No. 4,290,384 of Ausschnitt et al for "Coating Apparatus" suggests use of a mist but no spray and no spinning.

Japanese J6001248-A 85.01.19 (8509) Fujitsu, describes a resist coating method in which the atmosphere of resist solvent vapor is formed adjacent a semiconductor substrate and the resist is coated onto the semiconductor substrate. The solvent is discharged from one side of a porous disc. The resist is dropped onto the substrate. There is no spraying and no savings in resist material.

Japanese J02113518A 90.04.25 (9023) Mitsubishi Denki KK describes a resist coating device with a circular passage to introduce resist mist at a place surrounding the wafer on a spin chuck.

Japanese J02100314A 90.04.12 (9021) NEC Corp. describes an inner wall cup to coat a film of solvent or gas of photoresist.

In accordance with this invention, apparatus for treating a polymer coated substrate comprises as follows:
a) a support for the substrate,
b) an controlled chamber surrounding the substrate and the support,
c) means for introducing a solvent vapor into the chamber and
d) means for removing the solvent from the chamber.

Preferably, the support is rotatably supported for spinning.

Further in accordance with this invention, apparatus for treating a polymer coated substrate comprises:
a) a support for the substrate, the support being rotatably supported for spinning,
b) an enclosed chamber surrounding the substrate and the support,
c) means for introducing a solvent vapor into the chamber, and
d) means for removing the solvent from the chamber comprising an evacuated chamber coupled with the enclosed chamber for removing the solvent vapor from the enclosed chamber. Preferably, the means for introducing includes means for vaporizing solvent, and the means for introducing the solvent vapor comprises at least one vaporizing nozzle, and the support is rotatably supported for spinning.

The means for introducing can comprise an auxiliary vapor chamber coupled with the enclosed chamber for providing the solvent vapor to the enclosed chamber, or the means for removing comprises an evacuated chamber coupled with the enclosed chamber for removing the solvent vapor from the enclosed chamber. At least one vaporizing nozzle is provided for vaporizing solvent vapor. The means for introducing can comprise an auxiliary vapor chamber coupled with the enclosed chamber for providing the solvent vapor to the enclosed chamber.

The apparatus for coating a substrate with a polymer or other material comprises:
a) a support for the substrate,
b) a sealed chamber surrounding the substrate and the support,
c) means for introducing a solvent vapor into the chamber,
d) means for applying the polymer to the substrate, and
e) means for removing the solvent from the chamber.

Preferably, the support is rotatably supported for spinning. The means for introducing includes means for vaporizing solvent. The means for introducing the solvent vapor comprises at least one nozzle. In another embodiment the means for introducing the solvent vapor comprises at least one vaporizing nozzle and the support is rotatably supported for spinning. Alternatively, the means for introducing comprises an auxiliary vapor chamber coupled with the enclosed chamber for providing the solvent vapor to the enclosed chamber.

The means for removing comprises an evacuated chamber coupled with the enclosed chamber for removing the solvent vapor from the enclosed chamber. The means for applying the polymer comprises a spraying nozzle. Preferably, the means for applying the polymer comprises a plurality of spraying nozzles, which preferably are oriented obliquely.

A process of spin coating a soluble coating material upon a substrate comprising
a. applying a solvent enriching vapor upon a substrate,
b. subsequently spraying the coating material upon the substrate,
c. spinning the substrate, whereby thickness and uniformity are controlled.

Preferably, the process includes features as follows:
1. A spread out delay time is introduced between the spraying step and the spinning step.

2. The coating material comprises resist.
3. The substrate is spun at a high rpm during solvent vapor introduction.
4. The substrate is spun at a substantially lower or zero rpm during introduction of coating material.

After a step of thickness regulating spinning, a delay time is introduced before a step of solvent vapor evacuation.

During the spinning step and a spread out delay time, vapor pressure of the solvent enriching vapor is maintained substantially stable.

During the spinning step, solvent vapor pressure is substantially reduced by exhaust thereof into an evacuation outlet.

Ultrasonic agitation is applied to the system, during the delay time, before spinning.

Vibratory agitation is applied to the system, during the delay time, before spinning.

In another embodiment, the nozzles are scanned.

BRIEF DESCRIPTION OF THE DRAWINGS

FIG. 4 shows a modification of the system of FIG. 3 with the nozzles scanning linearly or rotationally.

DESCRIPTION OF THE PREFERRED EMBODIMENT

The technology exists to deliver a coating several mirometers ($\mu$m) thick upon a semiconductor wafer. For example, even so coarse a technology as spray painting could be employed for that purpose broadly. However, the uniformity of thickness and the control of the absolute thickness are far below those required for semiconductor processing.

The process of this invention involves spraying resist upon the work piece to cover it with only a few micrometers of photoresist. Concomitantly, the photoresist material is prevented from drying rapidly by provision of a controlled environment. A third control feature employed in accordance with this invention is the use of high speed spinning to control the thickness and uniformity of the resist. Because the final step of the process is similar to that used in conventional resist processing, the thickness and uniformity control are performed to at least as good a standard. Their performance are enhanced because the resist can planarize more fully using this process which retains vapor pressure longer.

Figure 1:
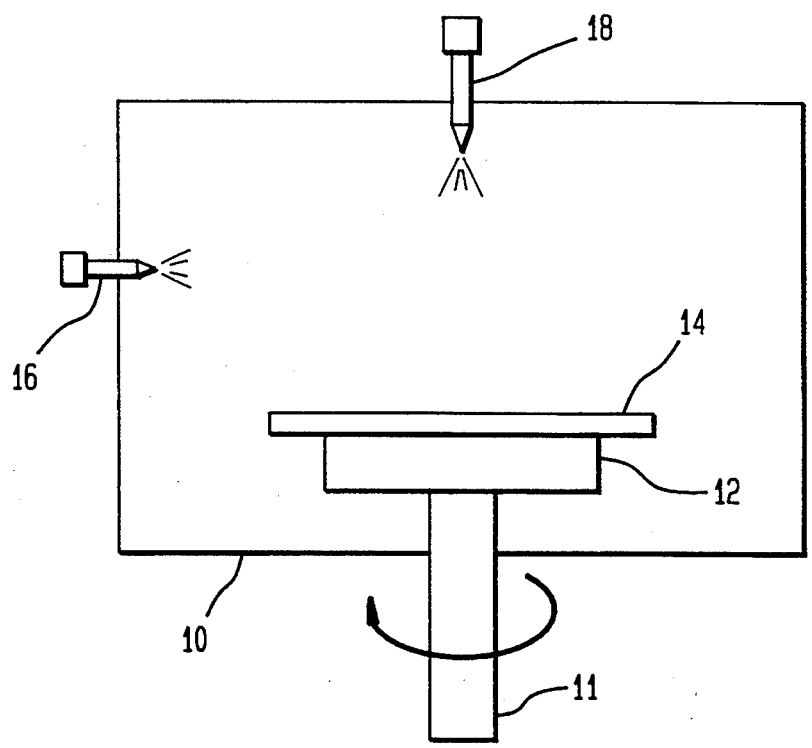
FIG. 1 shows a processing chamber for applying resist to a wafer supported upon a spinner chuck.

FIG. 1 shows an embodiment of a system for practicing the present invention. A reasonably airtight spinner chamber 10 (i.e. an enclosed, controlled chamber) houses a rotating chuck 12 driven by shaft 11. The chuck 12 carries a work piece, i.e. substrate, in the form of a semiconductor wafer 14. A vaporizing nozzle 16 delivers liquid solvent for the photoresist to the chamber 10 prior to the step of spray coating the photoresist.

Next, the resist is applied to the wafer 14 from the spray nozzle 18. After the desired uniformity and wet thickness are achieved by spinning, the vapor can be removed from chamber 10 to facilitate proper drying, by a conventional vent (not shown for convenience of illustration, but see FIG. 2 and the discussion thereof below.) Alternatively, the wafer 14 is relocated to a low vapor environment. Subsequently, the wafer 14 is baked in a conventional manner.

Figure 2:
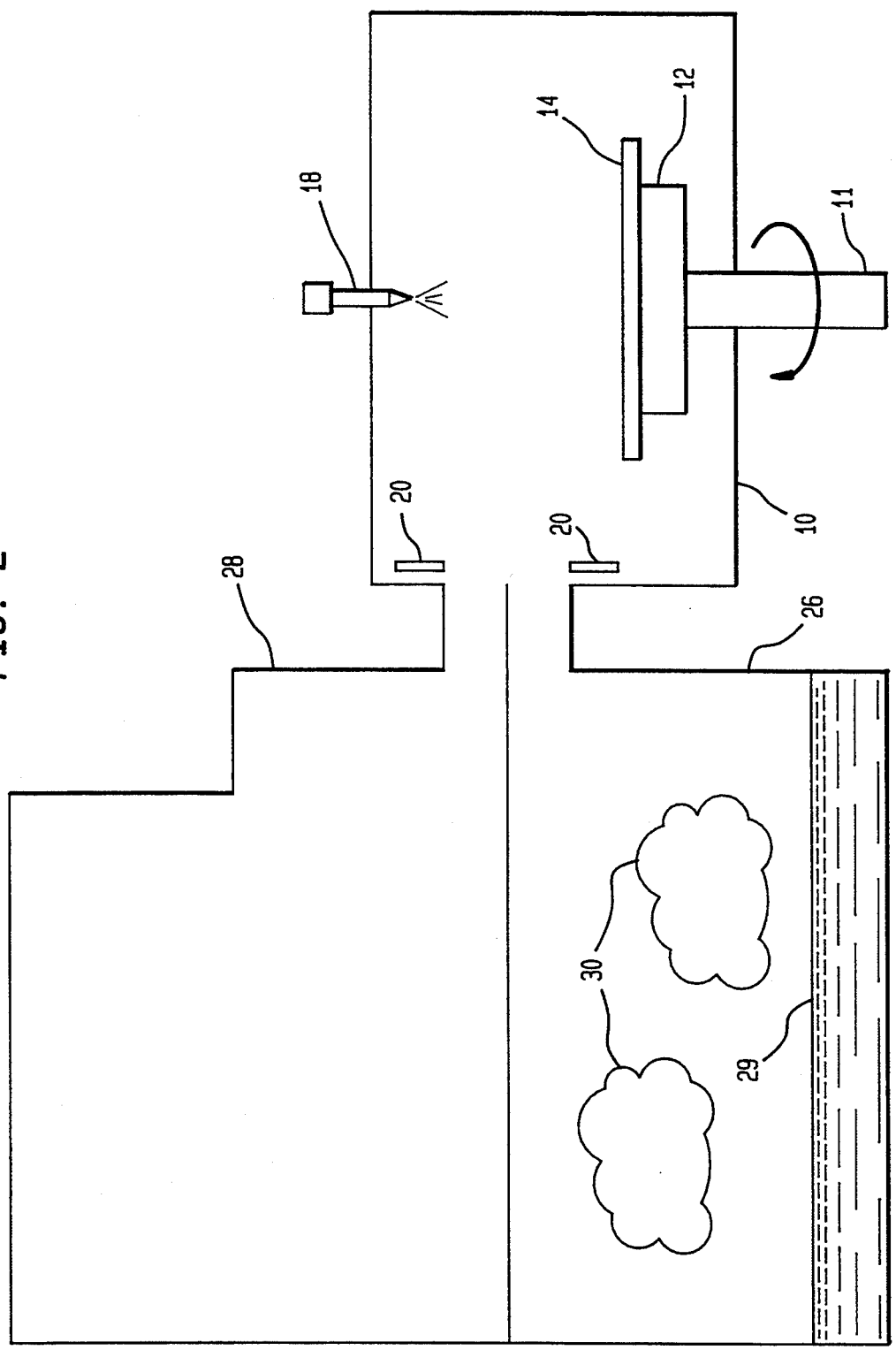
FIG. 2 shows the processing chamber of FIG. 1 juxtaposed with a vapor chamber containing a pool of liquid and vapor thereabove with a passageway leading to the processing chamber with an intervening load lock door, for replacing the vaporizing nozzle of FIG. 1. An evacuation chamber is connected to the processing chamber through another passageway controlled by another load lock door to the processing chamber.

FIG. 2 shows a vapor chamber 26 containing a pool of liquid 29 and vapor 30 thereabove with a passageway 23 leading to chamber 10 which can be closed by a load lock door 22. The vapor from chamber 26 can be used as a source to replace the vaporizing nozzle 16 in FIG. 1. An evacuation chamber 28 is shown connected through passageway 24 controlled by load lock door 21 to chamber 10 for removing the solvent vapor from the chamber 10 at the end of the process of planarizing the resist.

Figure 3:
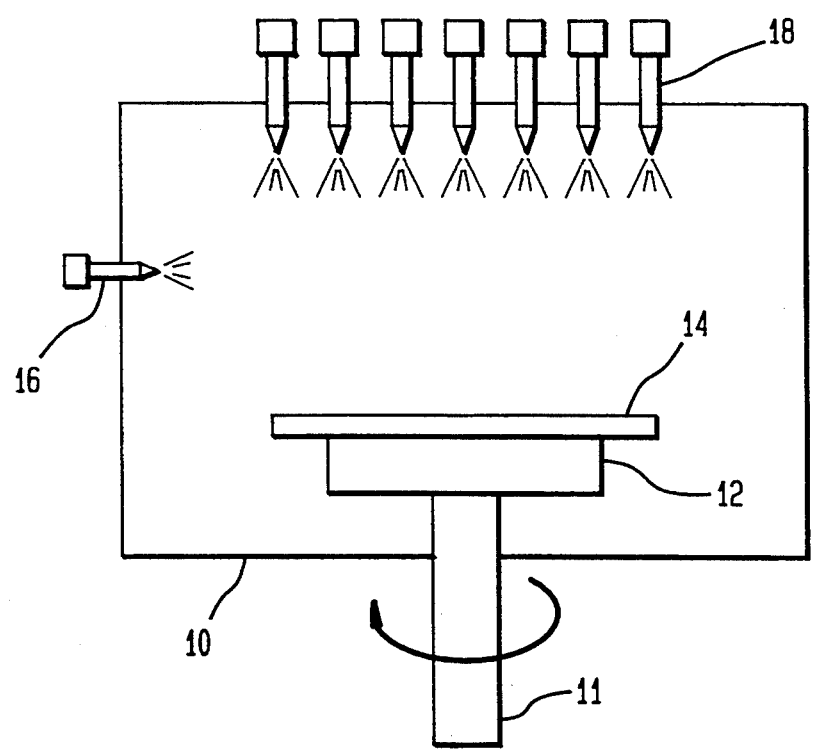
FIG. 3 shows a modification of the system of FIG. 1 with a multiple set of nozzles across the top surface of the processing chamber.

FIG. 3 shows a multiple set of nozzles 18 across the top surface of chamber 10 provided to supply photoresist sprays upon the wafer 14 more uniformly. A fixed matrix of nozzles 18 as shown in FIG. 3 or a scanning array of nozzles 18 as shown in FIG. 4 can be employed to provide that result. FIG. 4 shows a modification of the system of FIG. 3 with the nozzles scanning linearly or rotationally. In those variations, in one arrangement the nozzles 18 reciprocate linearly along path 31 parallel to the z axis. In the other arrangement the nozzles 18 rotate about circular paths as viewed from the x, y plane while directed at oblique angles.

The concentration of the solvent vapor should be kept high to prevent drying of the resist, yet not saturated such that the solvent may condense on a wafer 14, causing a non-uniform coating. The amount and duration of the solvent spray is a function of the duration and the quantity of the solvent in the resist which is sprayed upon wafer 14. A longer resist spray time or a higher resist dilution can use a shorter solvent spray duration.

EXAMPLE

An amount of 0.8 ml of approximate mixture of as follows:

| | |
|---|---|
| 2-ethoxy ethyl acetate | 5 parts |
| 4-butyrol acetone | 1 part | was sprayed into an approximately 3 liter closed chamber with an air brush at a pressure of 20 psia for a duration of 2 seconds prior to application of the resist which has a 32% solid content. The liquid resist was sprayed upon the 3 inch wafers for approximately 2 seconds. The wet resist had a thickness of approximately 10 $\mu$m. When the resist coverage is increased five times by spraying liquid resist, proportionately longer, no solvent pre-spray is required. The resist used to spray the three inch wafers is about 0.05 ml per wafer. Using the conventional puddle coating process, 1 ml of resist is required, which is about 20 times more or greater than an order of magnitude. To facilitate uniform spraying of resist from nozzles 18, the wafer 14 was spun at 60 rpm and the air brush system was aimed slightly off center to deliver more material from nozzles 18 towards the periphery of the wafer 14. Spread out time ran about 20 to 30 seconds to yield satisfactory uniformity.

An optimized vapor spray coating tool can further reduce the quantity of material consumed in the coating process. It is desirable to maintain the wafer 14 spinning at a high velocity rpm during the vapor introduction, so that if any solvent drops upon the wafer 14, it will be spread out thinly and uniformly. In a manufacturing system, multiple nozzles 18 can be used to spray more material towards the outside of the wafer 14.

SPREAD OUT TIME

A very important step in this invention is to allow the resist to spread out uniformly by delaying the thickness-controlling spinning after the spray of resist from nozzles 18. The duration of the spread out time varies as a function of as follows:

1) the viscosity of the resist,
2) the force of impact of the sprayed resist droplets,
3) the vapor pressure of the solvent.

Without the spread out delay in the example cited above, the coating was found to be full of radially oriented non-uniformity.

When planarization over topography is desired, a second spread out process can be used after the resist spun off has stopped being spun off, so that resist piled up at the edges of wafer topographical features due to centrifugal force can now settle down and spread out flat over the surface of the substrate.

The resultant baked resist has an average thickness of about 1.05 μm and a standard deviation of 0.3%, whereas that of the control wafers has an average thickness of 1.3μm and a standard deviation of 1.5% at a spin speed of 3480 rpm. The larger thickness from the control wafers confirms that the resist has started drying as soon as it forms a puddle on the wafer.

In summary, one or more nozzles is used to spray resist upon the wafer.

Preferably, a spinning step, after deposition of the resist is provided for thickness and uniformity control.

The resist solvent vapor pressure above the vapor is maintained high before resist is spun off the wafer. After the desired uniformity of thickness and wet thickness are achieved, the solvent vapor can be removed during the spinning. Alternately, the solvent vapor is removed after the spinning and a second spread out. Solvent vapor is removed to promote rapid drying. The film is applied at more than 1 micrometer and spun down to 1 micrometer.

A delay time is deliberately introduced between the spraying of the coating material and the spinning steps. Ultrasonic or vibratory agitation is applied to the system during the delay time to shorten the duration of the delay time among other things. Thus the ultrasonic or vibratory agitation is applied to the system, during the delay time, before spinning.

Preferably, the substrate is spun
at a high rpm during the introduction of vapor
at a substantially lower rpm during spraying and
at the thickness-regulating rpm after spraying and spread out.

A preferred embodiment of this invention is to provide a high rpm spinning step during the introduction of the solvent vapor.

A further preferred embodiment of this invention is to provide a low or zero rpm spinning step during spraying of the resist material onto the substrate.

During the final spinning step, solvent vapor pressure is maintained or evacuated depending upon the degree of planarization desired, with early evacuation providing higher throughput but less planarization.

A second spread out delay between the final spinning step and resist drying can be used to further planarize the resist coating but with corresponding reduction in throughput.

What is claimed is:

1. Apparatus for treating a coated substrate comprising:
    a) a support for a substrate,
    b) a controlled environment chamber surrounding said support and any substrate supported thereby,
    c) means for introducing a solvent vapor into said chamber and,
    d) means for removing said solvent from said chamber comprising an evacuated chamber coupled with said enclosed chamber for removing said solvent vapor from said enclosed chamber.

2. Apparatus in accordance with claim 1 wherein said support is rotatably supported for spinning.

3. Apparatus in accordance with claim 1 wherein said means for introducing includes means for vaporizing solvent.

4. Apparatus in accordance with claim 1 wherein said means for introducing said solvent vapor comprises at least one vaporizing nozzle.

5. Apparatus in accordance with claim 1 wherein said means for introducing said solvent vapor comprises at least one vaporizing nozzle, and said support is rotatably supported for spinning.

6. Apparatus in accordance with claim 1 wherein said means for introducing comprises an auxiliary vapor chamber coupled with said enclosed chamber for providing said solvent vapor to said enclosed chamber.

7. Apparatus for coating a substrate with a polymer comprising:
    a) a support for a substrate,
    b) a sealed chamber surrounding said support and any substrate supported thereby,
    c) means for introducing a solvent vapor into said chamber,
    d) means for applying said polymer to said substrate comprising a plurality of spraying nozzles, wherein said spraying nozzles are arrayed across said supported substrate, and
    e) means for removing said solvent from said chamber.

8. Apparatus in accordance with claim 7 wherein said support is rotatably supported for spinning.

9. Apparatus in accordance with claim 7 wherein said means for introducing includes means for vaporizing solvent.

10. Apparatus in accordance with claim 7 wherein said means for introducing said solvent vapor comprises at least one nozzle.

11. Apparatus in accordance with claim 7 wherein said means for introducing said solvent vapor comprises at least one vaporizing nozzle and said support is rotatably supported for spinning.

12. Apparatus in accordance with claim 7 wherein said means for introducing comprises an auxiliary vapor chamber coupled with said enclosed chamber for providing said solvent vapor to said enclosed chamber.

13. Apparatus in accordance with claim 7 wherein said means for removing comprises an evacuated chamber coupled with said enclosed chamber for removing said solvent vapor from said enclosed chamber.

14. Apparatus in accordance with claim 7 wherein said plurality of spraying nozzles are oriented obliquely to said substrate.

* * * * *